(12) United States Patent
Yang

(10) Patent No.: US 11,239,220 B2
(45) Date of Patent: Feb. 1, 2022

(54) SEMICONDUCTOR PACKAGE AND METHOD OF FABRICATING THE SAME

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/916,243

(22) Filed: Jun. 30, 2020

(65) Prior Publication Data
US 2021/0407972 A1  Dec. 30, 2021

(51) Int. Cl.
| H05K 7/10 | (2006.01) |
| H05K 7/12 | (2006.01) |
| H01L 25/16 | (2006.01) |
| H01L 23/13 | (2006.01) |
| H01L 23/498 | (2006.01) |
| H01L 23/00 | (2006.01) |

(Continued)

(52) U.S. Cl.
CPC .......... *H01L 25/16* (2013.01); *H01L 21/4853* (2013.01); *H01L 23/13* (2013.01); *H01L 23/3128* (2013.01); *H01L 23/3185* (2013.01); *H01L 23/49816* (2013.01); *H01L 24/48* (2013.01); *H01L 24/49* (2013.01); *H01L 24/73* (2013.01); *H01L 24/85* (2013.01); *H01L 21/56* (2013.01); *H01L 2224/4824* (2013.01); *H01L 2224/48227* (2013.01); *H01L 2224/49176* (2013.01); *H01L 2224/73215* (2013.01)

(58) Field of Classification Search
CPC ............... H01L 25/16; H01L 23/49816; H01L 21/4853; H01L 24/49; H01L 24/73; H01L 23/3185; H01L 24/85; H01L 24/48; H01L 23/3128; H01L 23/13; H01L 21/56; H01L 2224/4824; H01L 2224/73215; H01L 2224/48227; H01L 2224/49176
See application file for complete search history.

(56) References Cited

U.S. PATENT DOCUMENTS 5,991,161 A * 11/1999 Samaras ........... H01L 23/49816
174/16.3
9,432,298 B1 * 8/2016 Smith .................. H04L 49/9057
(Continued)

*Primary Examiner* — Yuriy Semenenko
(74) *Attorney, Agent, or Firm* — Muncy, Geissler, Olds & Lowe, P.C.

(57) ABSTRACT

The present disclosure provides a semiconductor package. The semiconductor package includes a carrier member, a plurality of inductors and a memory chip. The carrier member includes a first surface, a second surface and a centrally-located opening. The carrier member also includes a plurality of conductive pads on the second surface proximal to the opening. The memory chip is attached to the carrier member in a face-down manner. The memory chip includes a plurality of bidirectional and unidirectional signal-transmission pins electrically coupled to the inductors. The memory chip also includes a plurality of bonding pads. A plurality of bonding wires, passing through the opening, electrically connect the bonding pads on the memory chip to the conductive pads on the carrier member. A first insulative structure substantially encapsulates the memory chip and the inductors. A plurality of solder balls are attached to the second surface of the carrier member.

18 Claims, 21 Drawing Sheets

(51) Int. Cl.
*H01L 23/31* (2006.01)
*H01L 21/48* (2006.01)
*H01L 21/56* (2006.01)

(56) References Cited

U.S. PATENT DOCUMENTS

| | | | |
|---|---|---|---|
| 10,860,417 B1* | 12/2020 | Spirkl | G11C 7/10 |
| 2010/0246152 A1* | 9/2010 | Lin | H01L 25/18 |
| | | | 361/783 |
| 2011/0024888 A1* | 2/2011 | Pagaila | H01L 25/0657 |
| | | | 257/686 |
| 2011/0210419 A1* | 9/2011 | Kim | H01L 25/0657 |
| | | | 257/531 |
| 2012/0139641 A1* | 6/2012 | Kaczman | H03F 3/68 |
| | | | 330/295 |
| 2017/0316881 A1* | 11/2017 | Bachman | H01L 23/50 |
| 2018/0315459 A1* | 11/2018 | Kim | G11C 5/147 |
| 2019/0156872 A1* | 5/2019 | Kim | G11C 29/023 |

* cited by examiner ical field

SEMICONDUCTOR PACKAGE AND METHOD OF FABRICATING THE SAME

TECHNICAL FIELD

The present disclosure relates generally to a semiconductor package, and more particularly, to a semiconductor package that includes inductors and a method for fabricating the semiconductor package.

DISCUSSION OF THE BACKGROUND

Synchronous dynamic random-access memory (SDRAM) is a new type of memory device that mainly uses a synchronous clock to control input and output signals of the memory. Computing devices utilize various types of SDRAM, such as double data rate (DDR) SDRAM. DDR is a memory transmission standard and indicates that there are two transmissions per clock cycle. As technology improves, the capacity of DDR SDRAM devices in computing devices has increased significantly. Earlier DDR SDRAMs are retroactively referred to as DDRx SDRAMs. This series of standards has evolved from DDR1 to DDR2, DDR3 and DDR4.

Signal quality is of great importance when data or address information is input into or output from a memory device. SDRAMs are capable of achieving greater concurrency and higher data transfer rates than conventional DRAMs. However, when SDRAMs are operated at high frequencies, a signal between the memory controller and the memory device may be distorted after the signal is transmitted. Signal distortion is one of several signal-quality problems that are caused not by a single factor, but by a variety of factors. Such signal distortion may result in incorrect data or a system malfunction in the memory device. Therefore, there is a need to prevent signal distortion in order to ensure signal integrity.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor package. The semiconductor package includes a carrier member, a plurality of inductors on the carrier member and a memory chip on the carrier member. The memory chip includes a plurality of bidirectional signal-transmission pins electrically coupled to the inductors.

In some embodiments, the carrier member includes a first surface, a second surface remote from the first surface, and a centrally-located opening extending from the first surface to the second surface. The inductors and the memory chip are disposed on the first surface and electrically coupled to the carrier member.

In some embodiments, the carrier member includes a plurality of conductive pads and the memory chip includes a plurality of bonding pads. A plurality of bonding wires pass through the opening and electrically connect the bonding pads on the memory chip to the conductive pads on the carrier member.

In some embodiments, the semiconductor package further includes a first insulative structure substantially encapsulating the memory chip and the inductors.

In some embodiments, the first insulative structure covers a portion of the first surface of the carrier member.

In some embodiments, the semiconductor package further includes a plurality of solder balls attached to the second surface of the carrier member. The solder balls are electrically connected to the carrier member.

In some embodiments, the carrier member further includes a substrate between the first surface and the second surface, a plurality of conductive traces on the first surface and the second surface, and an internal circuit, comprised of at least one layer, within the substrate and electrically coupled to the conductive traces.

In some embodiments, the inductors are electrically coupled to the internal circuit in the carrier member through the conductive traces.

In some embodiments, the inductors form two parallel inductor rows, located at opposite sides of the memory chip.

In some embodiments, the memory chip further includes a plurality of unidirectional signal-transmission pins, utilized in a partial write operation in which at least some of write data transmitted through the bidirectional signal-transmission pins is masked, electrically connected to the inductors.

Another aspect of the present disclosure provides a method of fabricating a semiconductor package. The method includes providing a carrier member; disposing a plurality of inductors on the carrier member; and disposing a memory chip on the carrier member, the memory chip comprising a plurality of bidirectional signal-transmission pins electrically coupled to the inductors.

In some embodiments, the carrier member includes a first surface, a second surface remote from the first surface, and a centrally-located opening extending from the first surface to the second surface. The inductors and the memory chip are disposed on the first surface and electrically coupled to the carrier member.

In some embodiments, the carrier member includes a plurality of conductive pads and the memory chip includes a plurality of bonding pads, wherein a plurality of bonding wires pass through the opening and electrically connect the bonding pads on the memory chip to the conductive pads on the carrier member.

In some embodiments, the method further includes forming a first insulative structure to substantially encapsulate the memory chip and the inductors.

In some embodiments, the first insulative structure covers a portion of the first surface of the carrier member.

In some embodiments, the method further includes mounting a plurality of solder balls on the second surface of the carrier member. The solder balls are electrically connected to the carrier member.

In some embodiments, the carrier member further includes a substrate between the first surface and the second surface, a plurality of conductive traces on the first surface and the second surface, and at least one layer of internal circuit within the substrate and electrically coupled to the conductive traces.

In some embodiments, the inductors are electrically coupled to the internal circuit in the carrier member through the conductive traces.

In some embodiments, the inductors form two parallel inductor rows, located at opposite sides of the memory chip.

In some embodiments, the memory chip further includes a plurality of unidirectional signal-transmission pins, utilized in a partial write operation in which at least some of write data transmitted through the bidirectional signal-transmission pins are masked, electrically coupled to the inductors.

In the present disclosure, a semiconductor package comprising a plurality of inductors arranged adjacent to a memory chip is provided. The memory chip may be a memory device. When the semiconductor package is coupled to a memory controller and the memory chip operates at high frequencies, e.g., at 2133 MHz to 4266 MHz, signal quality between the memory controller and the memory chip can be improved. Specifically, the inductors are electrically coupled to a plurality of DQ pins on the memory chip, wherein the DQ pins are related to data signals. Because the inductors are electrically connected to the carrier member and the memory chip is also electrically connected to the carrier member, the inductor is substantially electrically connected in series to the DQ pin on the memory chip. Therefore, the inductors can reduce the rising speed and/or dropping speed of a signal when the memory chip is in operation. As a result, the signal overshoot and/or undershoot may be reduced. The waveform of an output signal of the memory chip can be stabilized due to the reduction of signal overshoot or undershoot. In addition, the impedance produced by the inductors will increase as the operating frequency of the inductors increases. Therefore, the inductors can be applied to a wide range of operating frequencies, and the capability of suppressing the signal overshoot or undershoot can be further increased when the inductors operate at a higher frequency. As a result, with the inclusion of the inductors at both sides of the memory chip, the undesirable signal overshoot/undershoot occurring in the data signal transmitted from the memory controller to the memory chip or the data signal transmitted from the memory chip to the memory controller can be suppressed.

The foregoing has outlined rather broadly the features and technical advantages of the present disclosure in order that the detailed description of the disclosure that follows may be better understood. Additional features and technical advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
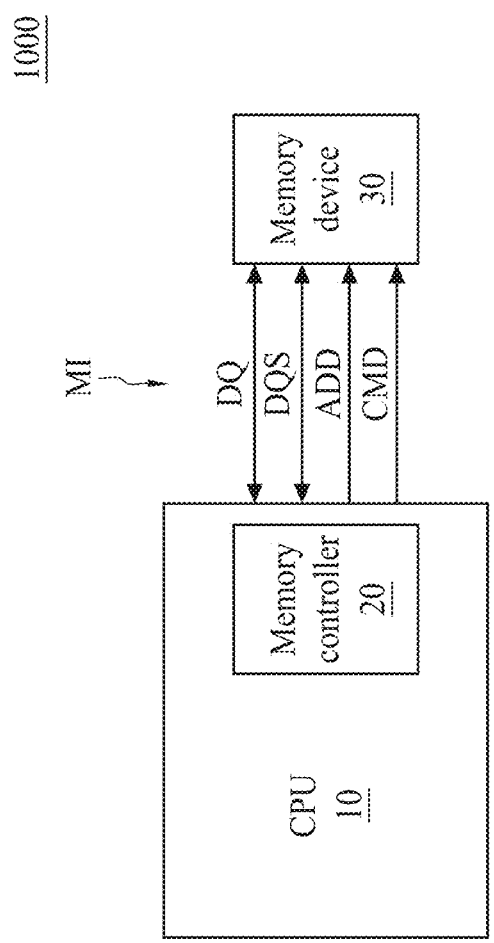
FIG. 1 is a circuit block diagram of an electronic system, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of a plurality of other features, integers, steps, operations, elements, components, or groups thereof.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, the description may use perspective-based descriptions such as up/down, front/back, and top/bottom. Such descriptions are merely used to facilitate discussion and are not intended to restrict the application of embodiments described herein to any particular orientation.

FIG. 1 is a circuit block diagram of an electronic system 1000, in accordance with some embodiments of the present disclosure. With reference to FIG. 1, the electronic system 1000 includes a central processing unit (CPU) 10, a memory interface MI and a memory device 30. In some embodiments, the CPU 10 may include a memory controller 20 integrated in the CPU 10. In other embodiments, the memory controller 20 may be discrete from the CPU 10. The memory controller 20 is electrically connected to the memory device 30 through the memory interface MI. The memory controller 20 provides various control signals such as a command signal and an address signal, to the memory device 30. The command signal and the address signal can be respectively transmitted from the memory controller 20 to the memory device 30 through a command bus CMD and an address bus ADD of the memory interface MI. The memory interface MI further includes multiple bidirectional data buses DQ and DQS for transmitting data signals and data strobe signals between the memory controller 20 and the memory device 30. In some embodiments, the electronic system 1000 may include more elements than illustrated in FIG. 1. In some embodiments, the memory device 30 may be a DDR4 SDRAM or a low-power DDR4 SDRAM, which are fabricated using 20 nm technology.

Figure 2:
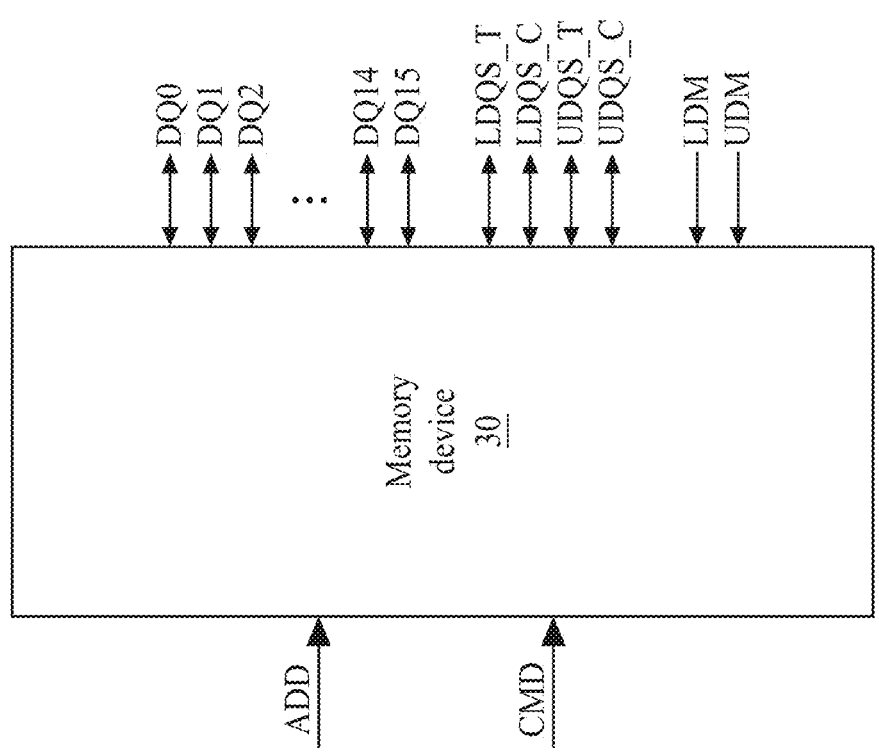
FIG. 2 is a schematic diagram showing a plurality of pins on the memory device in FIG. 1, in accordance with some embodiments of the present disclosure.

FIG. 2 is a schematic diagram showing a plurality of pins on the memory device 30 in FIG. 1, in accordance with some embodiments of the present disclosure. In some embodiments, the memory device 30 may have multiple bidirectional signal-transmission pins such as DQ0 to DQ15, LDQS_T, LDQS_C, UDQS_T, and UDQS_C. In some embodiments, the memory device 30 may have multiple unidirectional signal-transmission pins such as lower data mask (LDM) and upper data mask (UDM) as input mask signals for writing data. In some embodiments, the unidirectional signal-transmission pins may be proximal to the bidirectional signal-transmission pins, wherein the LDM corresponds to the data on DQ0~DQ7 and the UDM correspond to the data on DQ8~DQ15. In addition, the command bus CMD and the address bus ADD are electrically connected to the memory device 30.

Figure 3A:
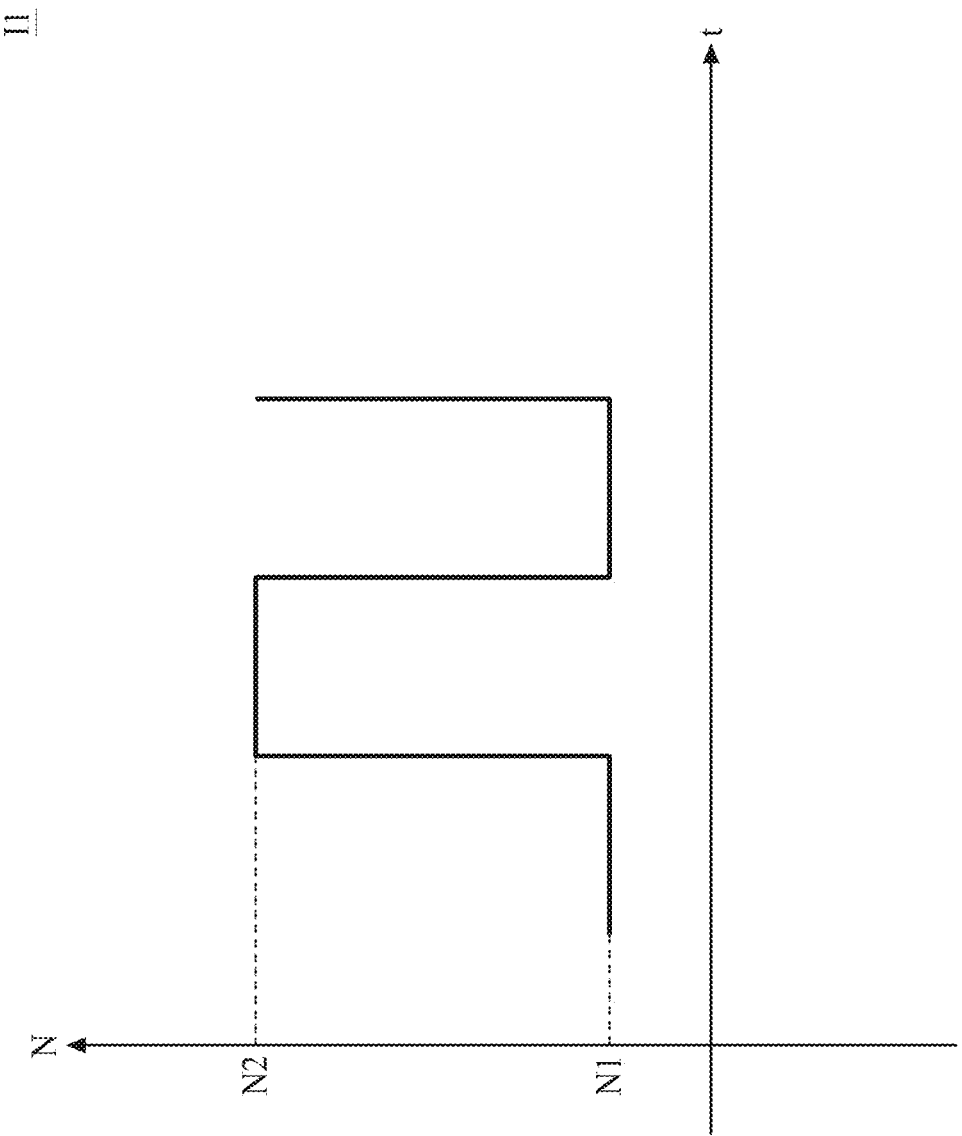
FIG. 3A is a schematic diagram showing a first signal generated by the memory controller in FIG. 1, wherein the first signal represents a piece of data or control signal that is to be transmitted to the memory device in FIG. 1, in accordance with some embodiments of the present disclosure.
Figure 3B:
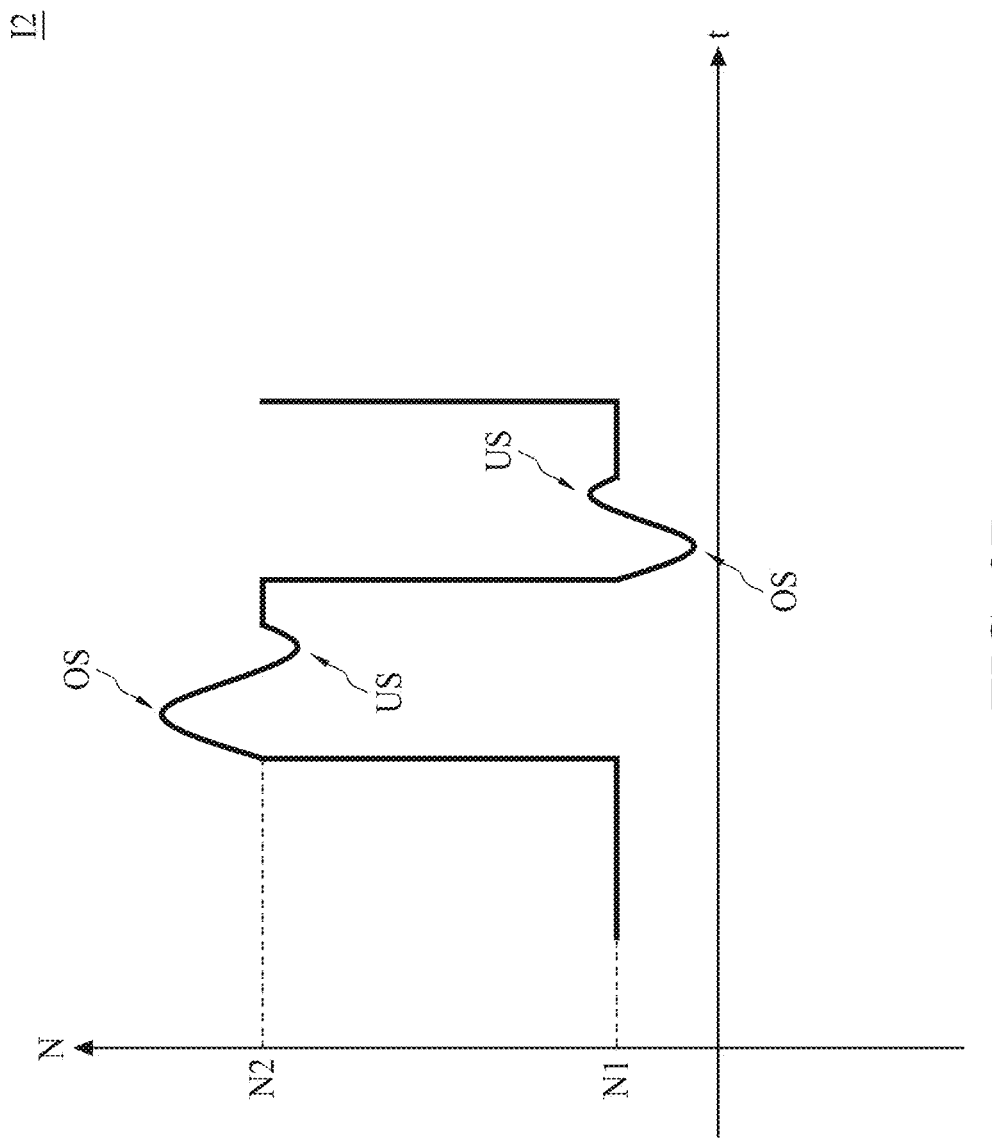
FIG. 3B is a schematic diagram showing a second signal input into the memory device in FIG. 1 after the piece of data or control signal is transmitted through a transmission path, in accordance with some embodiments of the present disclosure.

In a comparative embodiment, when the memory device 30 in FIG. 1 or FIG. 2 operates at high frequencies, e.g., at 2133 MHz to 4266 MHz, a signal from the memory controller 20 to the memory device 30 may be distorted after the signal is transmitted. For example, please refer to FIG. 1, FIG. 3A and FIG. 3B. FIG. 3A is a schematic diagram showing a first signal I1 generated by the memory controller 20, wherein the first signal I1 represents a piece of data or control signal that is to be transmitted to the memory device 30. FIG. 3B is a schematic diagram showing a second signal I2 input into the memory device 30 after the piece of data or control signal is transmitted through a transmission path (not shown), wherein the transmission path includes the memory interface MI in FIG. 1. In FIG. 3A and FIG. 3B, the signals I1 and I2 are shown in square waves, wherein the x-axis represents time (t) and the y-axis represents a signal value (N). Theoretically, the second signal I2 should have the same waveform as the first signal I1 since the first signal I1 and the second signal I2 carry identical data or control information. However, as can be seen in FIG. 3A and FIG. 3B, the second signal I2 differs from the first signal I1.

When a signal passes through a transmission path, some signal quality problems may occur. The signal quality problems may be caused not by a single factor, but by a variety of factors. For example, high speeds of integrated circuits (ICs), improper layout of memory chips, incorrect routing design or high-frequency signals can all cause poor signal quality, which may bring about signal distortion, timing errors, incorrect data or system malfunctions. For example, still referring to FIG. 3B, the signal distortion comes mainly from a signal overshoot OS and a signal undershoot US. The signal overshoot OS and/or US refers to a transitory state of a signal over its steady level during its transition from one value to another, for example, from a first value N1 to a second value N2. The signal distortion may occur frequently in a memory device, especially when the memory device operates at high frequencies. Therefore, there is a significant need to decrease the occurrence of signal overshoot and undershoot, as well as reduce other issues causing signal distortions to ensure signal validity.

Figure 4:
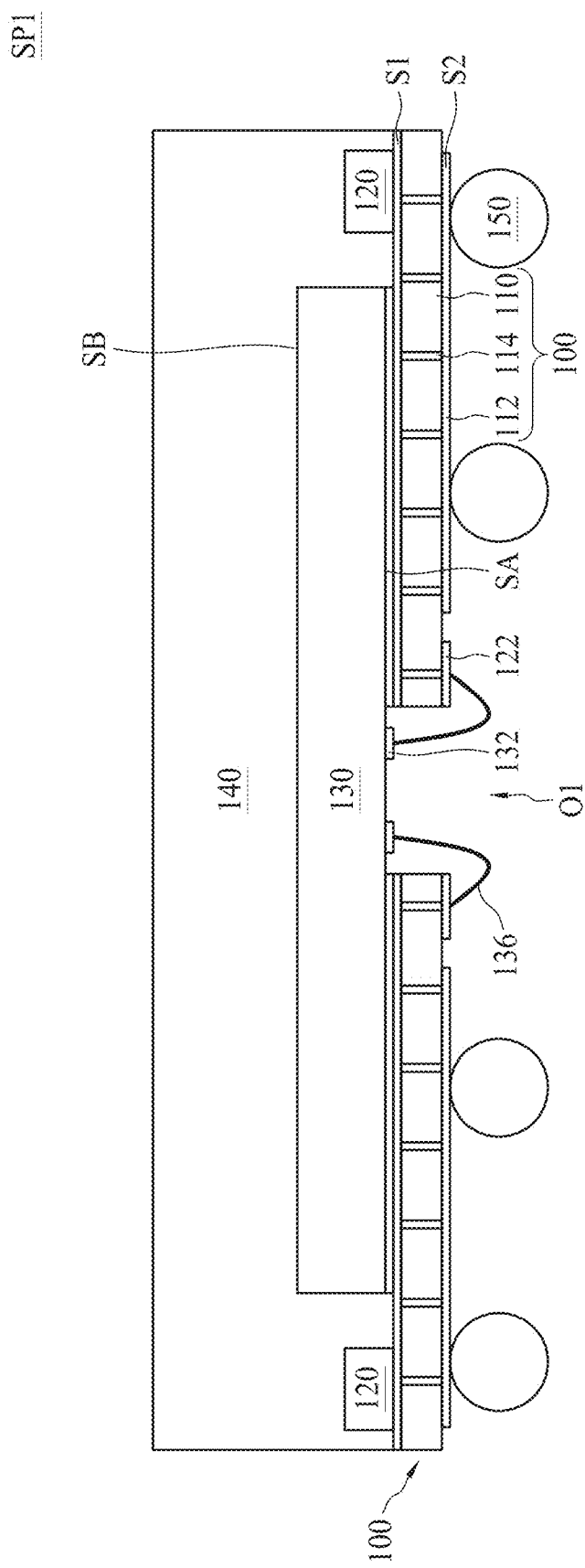
FIG. 4 is a schematic cross-sectional view of a semiconductor package, in accordance with some embodiments of the present disclosure.

FIG. 4 is a schematic cross-sectional view of a semiconductor package SP1, in accordance with some embodiments of the present disclosure. The semiconductor package SP1 primarily includes a carrier member 100, a plurality of inductors 120, and a memory chip 130. The carrier member 100 includes a first surface S1, a second surface S2 remote from the first surface S1, and a centrally-located opening O1 extending from the first surface S1 to the second surface S2. The carrier member 100 also includes a substrate 110 between the first surface S1 and the second surface S2, a plurality of conductive traces 112 on the first surface S1 and the second surface S2, and an internal circuit 114 comprised of at least one layer within the substrate 110 and electrically coupled to the conductive traces 112. In addition, the carrier member 100 includes a plurality of conductive pads 122 on the second surface S2 of the carrier member 100 proximal to the opening O1, wherein the conductive pads 122 are electrically coupled to the internal circuit 114 within the substrate 110. The inductors 120 are placed on the first surface S1 of the carrier member 100 using a die-attaching material (not shown). In addition, the inductors 120 are symmetrically located at both sides of the memory chip 130. The die-attaching material not only provides a solder function but also acts as a conductive medium between the inductors 120 and the conductive traces 112 on the carrier member 100. The inductors 120 are electrically coupled to the internal circuit 114 in the carrier member 100 through the conductive traces 112. The memory chip 130 has a plurality of bidirectional signal-transmission pins (not shown) for data input/output. In addition, the memory chip 130 has a plurality of unidirectional signal-transmission pins (not shown) proximal to the bidirectional signal-transmission pins. The memory chip 130 has an active surface SA and a back surface SB remote from the active surface SA. The memory chip 130 is attached to the carrier member 100 in a face-down manner using a die-attaching material (not shown). Specifically, the active surface SA of the memory chip 130 is placed on the first surface S1 of the carrier member 100 and thus exposing a portion of the active surface SA through the opening O1. The die-attaching material not only provides a solder function but also acts as a conductive medium between the memory chip 130 and the conductive traces 112 on the carrier member 100. In addition, the memory chip 130 includes a plurality of bonding pads 132 on the active surface SA. A plurality of bonding wires 136, passing through the opening O1, electrically connect the bonding pads 132 on the memory chip 130 to the conductive pads 122 on the carrier member 100. Therefore, the memory chip 130 is electrically coupled to the internal circuit 114 in the carrier member 100 through the bonding wires 136 and the conductive traces 112. A first insulative structure 140 substantially encapsulates the memory chip 130 and the inductors 120. In addition, the first insulative structure 140 covers a portion of the first surface S1 of the carrier member 100 not occupied by the memory chip 130 and the inductors 120. A plurality of solder balls 150 are attached to the second surface S2 of the carrier member 100. The solder balls 150 are electrically connected to the carrier member 100.

Figure 5:
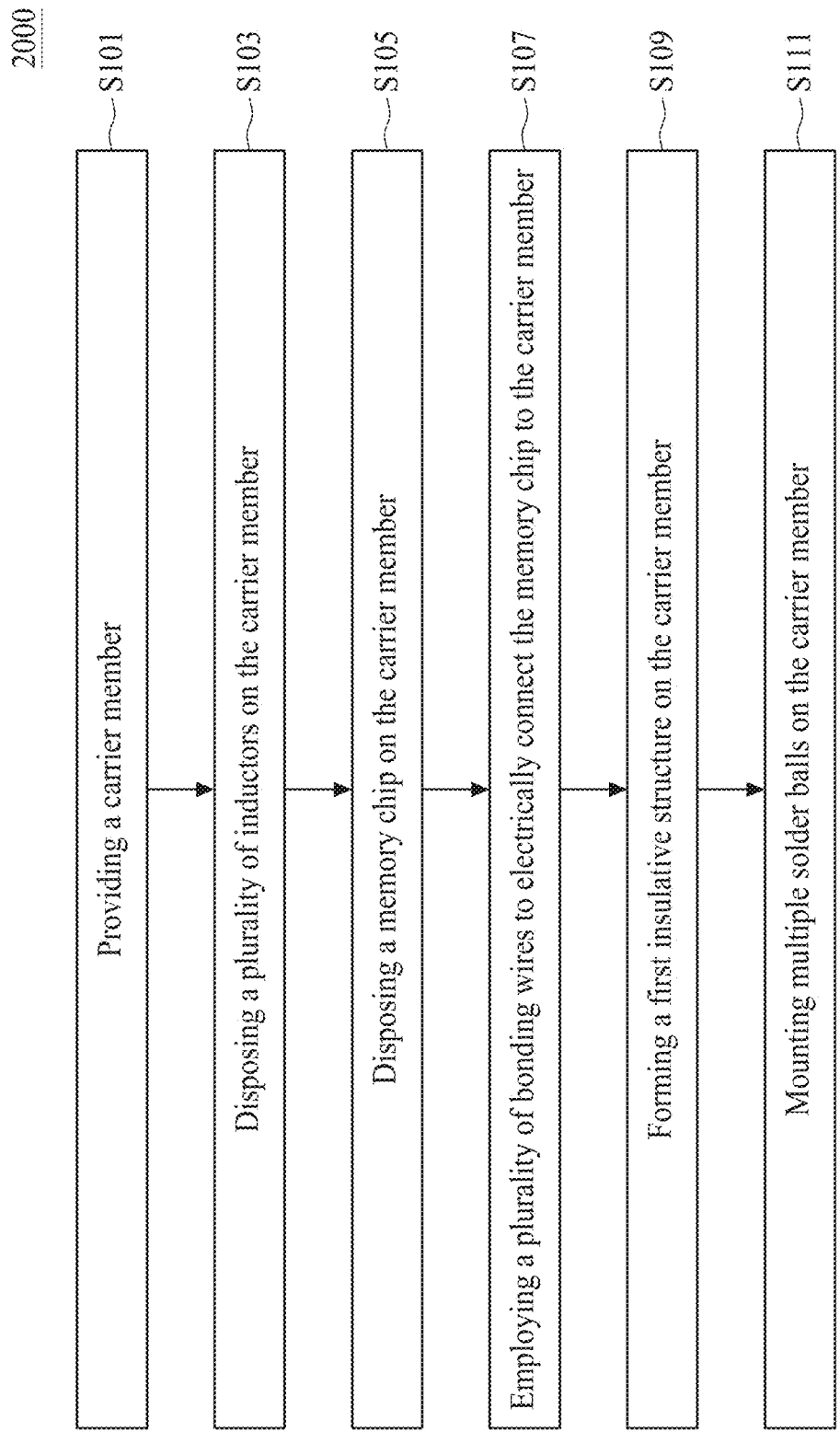
FIG. 5 is a flow diagram illustrating a method for fabricating the semiconductor package in FIG. 4, in accordance with some embodiments of the present disclosure.

FIG. 5 is a flow diagram illustrating a method 2000 for fabricating the semiconductor package SP1 in FIG. 4, in accordance with some embodiments of the present disclosure. FIGS. 7, 9, 11, 13, 15 and 16 are schematic cross-sectional views showing sequential fabrication stages according to the method 2000 in FIG. 5, in accordance with some embodiments of the present disclosure.

Figure 6:
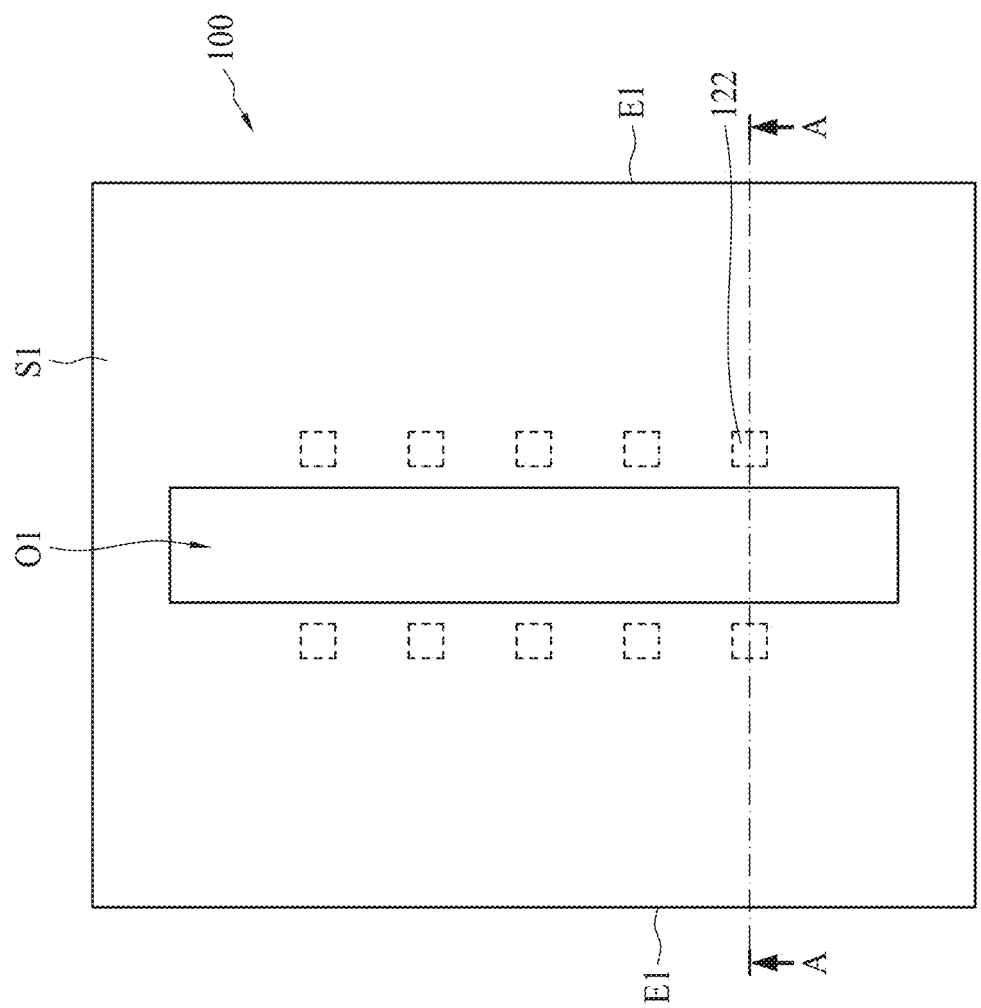
FIG. 6 is a top view showing a carrier member with a width defined by a pair of first edges, in accordance with some embodiments of the present disclosure.
Figure 7:
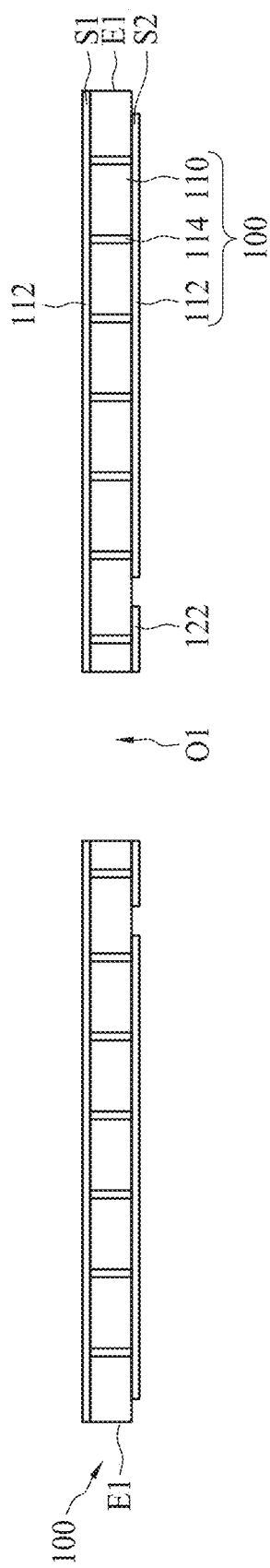
FIG. 7 is a schematic cross-sectional view of the carrier member in FIG. 6 taken along the line A-A, in accordance with some embodiments of the present disclosure.

With reference to FIGS. 6 and 7, a carrier member 100 is provided according to step S101 in FIG. 5. FIG. 6 is a top view showing the carrier member 100 with a width defined by a pair of first edges E1, and FIG. 7 is a schematic cross-sectional view of the carrier member 100 in FIG. 6 taken along the line A-A. In some embodiments, the carrier member 100 may have a centrally-located opening O1, which can be formed by, for example, a drilling process to penetrate the carrier member 100. In some embodiments, the opening O1 may have a square or rectangular profile when viewed in a top perspective, but is not limited thereto. The function of the opening O1 is to facilitate routing between the carrier member 100 and a component subsequently formed thereon. As can be seen in FIG. 7, the carrier member 100 has an approximately planar first surface S1 and an approximately planar second surface S2 remote from the first surface S1, wherein the opening O1 extends from the first surface S1 to the second surface S2. In some embodiments, the carrier member 100 may include a substrate 110, a plurality of conductive traces 112 and an internal circuit 114 comprised of at least one layer. The substrate 110 is between the first surface S1 and the second surface S2 of the carrier member 100. The conductive traces 112 are disposed on the first surface S1 and the second surface S2 of the carrier member 100. In some embodiments, the conductive traces 112 may include any of a variety of electrically conductive materials including, for example, metals such as gold (Au), copper (Cu), aluminum (Al), metal alloys, and/or solderable materials. The internal circuit 114 comprised of at least one layer is embedded in the substrate 110 and electrically coupled to the conductive traces 112. The detailed structure of the internal circuit 114 is not depicted or described explicitly for the sake of brevity. In some embodiments, the carrier member 100 may include multiple layers of internal circuits 114. In addition, in some embodiments, a plurality of conductive pads 122 may be formed on the second surface S2 of the carrier member 100 proximal to the opening O1. In some embodiments, the conductive pads 122 may include any of a variety of electrically conductive materials including, for example, metals such as gold (Au), copper (Cu), aluminum (Al), metal alloys, and/or solderable materials. In some embodiments, the conductive pads 122 are electrically coupled to the internal circuit 114 within the substrate 110 and can provide an electrical connection with a component subsequently connected thereto.

Figure 8:
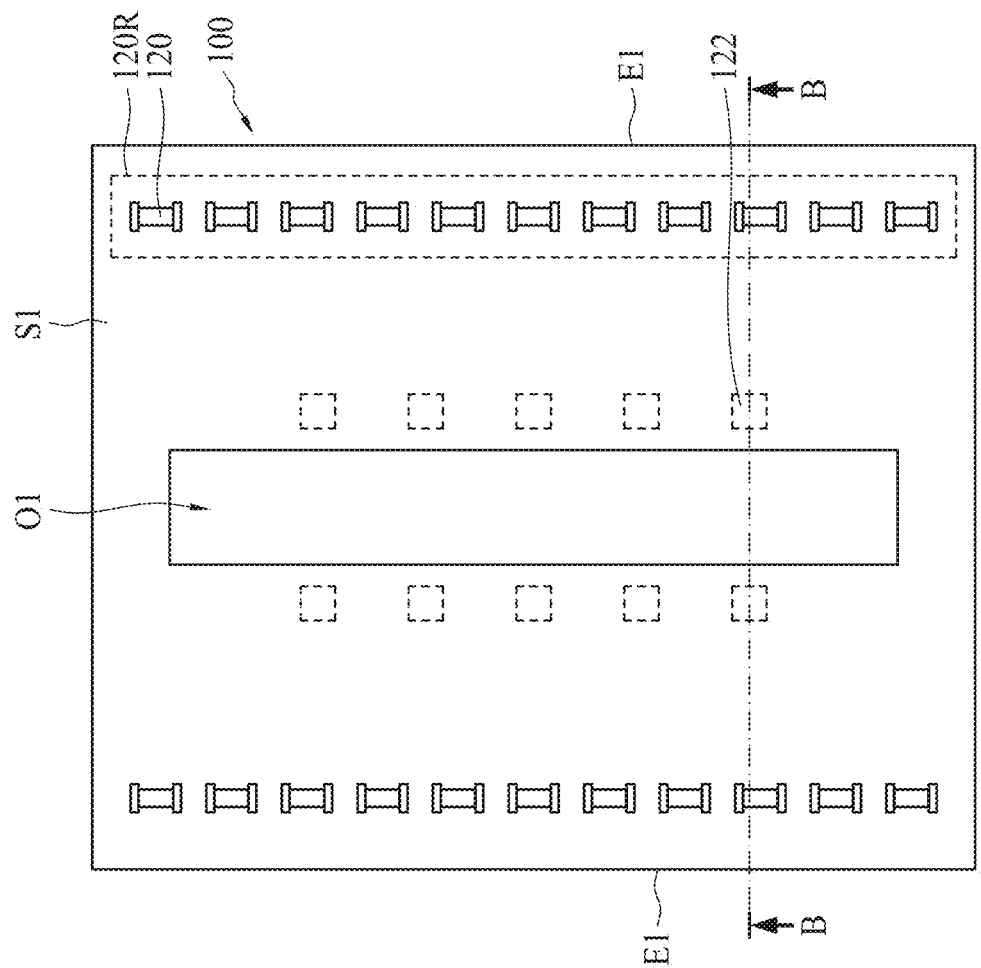
FIG. 8 is a top view showing the arrangement of inductors on the carrier member, in accordance with some embodiments of the present disclosure.
Figure 9:
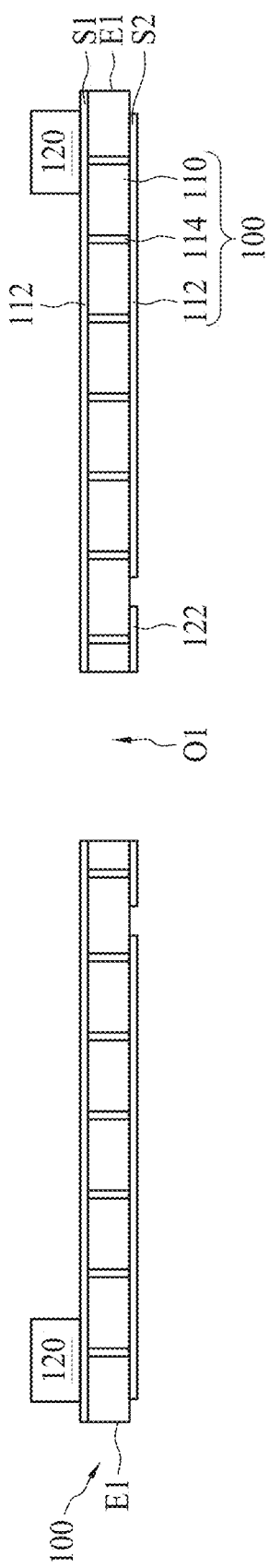
FIG. 9 is a schematic cross-sectional view of the carrier member in FIG. 8 taken along the line B-B, in accordance with some embodiments of the present disclosure.

With reference to FIGS. 8 and 9, a plurality of inductors 120 are disposed on the carrier member 100 according to step S103 in FIG. 5. FIG. 8 is a top view showing the arrangement of the inductors 120 on the carrier member 100, and FIG. 9 is a schematic cross-sectional view of the carrier member 100 in FIG. 8 taken along the line B-B. In some embodiments, the inductors 120 are of the standard SMD/SMT 0402 (1005 metric). In some embodiments, the inductors 120 have the ultra-compact size, 0.4 mm by 0.2 mm (0.4×0.2 mm). In some embodiments, the inductors 120 may be attached to the carrier member 100 via a die-attaching material (not shown). The die-attaching material may not only provide a solder function but also act as a conductive medium between the inductors 120 and the conductive traces 112 on the carrier member 100. Therefore, the inductors 120 may be electrically coupled to the internal circuit 114 in the carrier member 100 through the die-attaching material and the conductive traces 112. Referring to FIG. 8, in some embodiments, the inductors 120 may be symmetrically located at a peripheral region of the carrier member 100. Specifically, the inductors 120 are placed on the first surface S1 distal from the opening O1. In some embodiments, the inductors 120 are lined up and form two inductor rows 120R, wherein the two inductor rows 120R are located at opposite sides of the opening O1 and parallel to the pair of first edges E1 of the carrier member 100.

Figure 10:
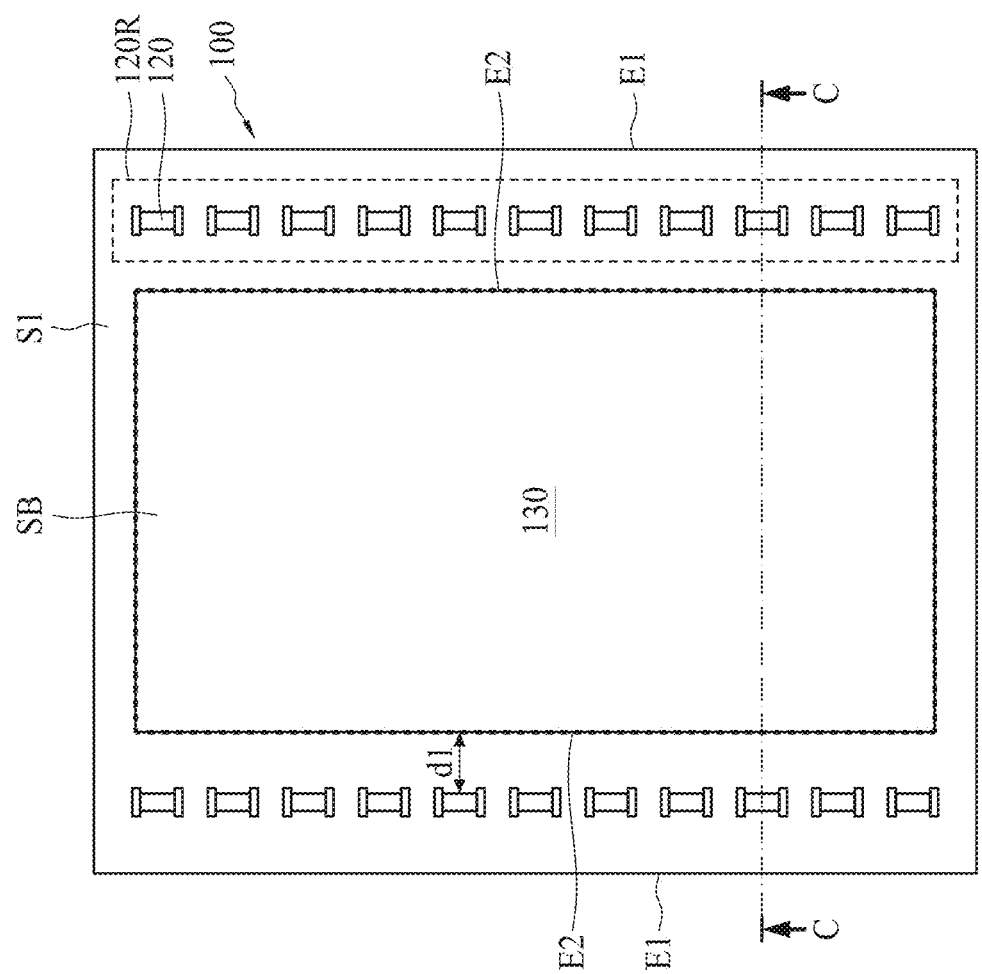
FIG. 10 is a top view showing the relative position of the memory chip and the inductors on the carrier member, in accordance with some embodiments of the present disclosure.
Figure 11:
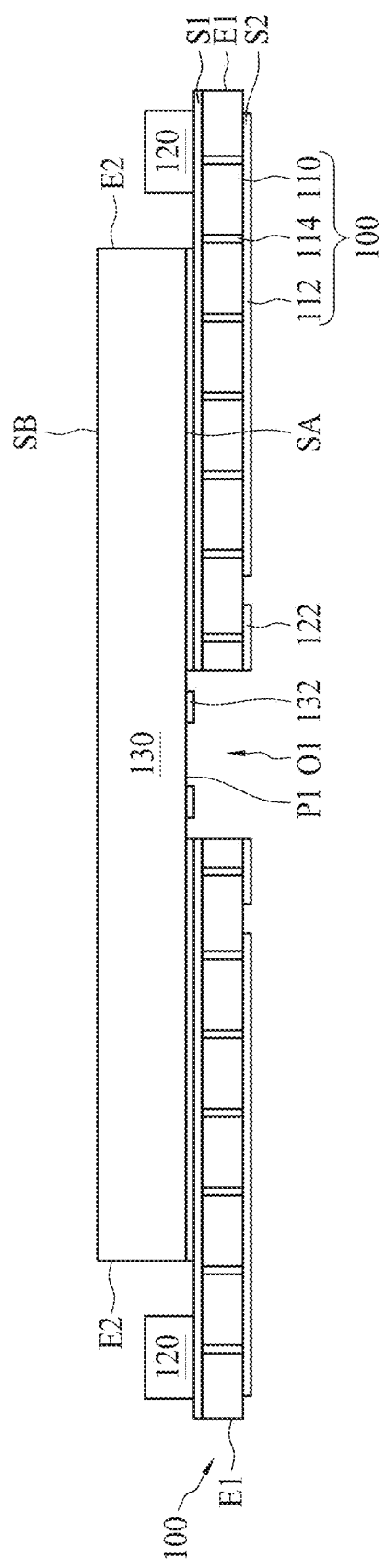
FIG. 11 is a schematic cross-sectional view of the carrier member in FIG. 10 taken along the line C-C, in accordance with some embodiments of the present disclosure.

With reference to FIGS. 10 and 11, a memory chip 130 is disposed on the carrier member 100 according to step S105 in FIG. 5. FIG. 10 is a top view showing the relative position of the memory chip 130 and the inductors 120 on the carrier member 100, and FIG. 11 is a schematic cross-sectional view of the carrier member 100 in FIG. 10 taken along the line C-C. In some embodiments, the memory chip 130 may be a memory device such as a DDR4 SDRAM or a low-power DDR4 SDRAM. In some embodiments, the memory chip 130 may have a plurality of bidirectional signal-transmission pins (not shown) for data input/output and a plurality of unidirectional signal-transmission pins (not shown) as input mask signals for writing data. In some embodiments, the unidirectional signal-transmission pins are located closely to the bidirectional signal-transmission pins and traces in the memory chip for transmitting the input mask signals are proximal to traces for transmitting the data signals. In some embodiments, the unidirectional signal-transmission pins are utilized in a partial write operation in which at least some of write data transmitted through the bidirectional signal-transmission pins are masked. Still referring to FIG. 10, in some embodiments, the memory chip 130 is flanked by the inductor rows 120R. Specifically, the two inductor rows 120R are located at opposite sides of the memory chip 130 and each one of the inductor rows 120R is spaced from the memory chip 130 by a predetermined distance dl. In some embodiments, the predetermined distance dl may be as small as possible so as to position the memory chip 130 proximal to the inductor rows 120R. In some embodiments, the number of inductors 120 arranged on either side of the memory chip 130 corresponds to the number of critical pins on the memory chip 130. For example, the number of the inductors 120 is at least equal to the number of bidirectional signal-transmission pins and unidirectional signal-transmission pins of the memory chip 130. In some embodiments, the bidirectional signal-transmission pins and the unidirectional signal-transmission pins are electrically coupled to the inductors 120. In some embodiments, the inductor row 120R may include five to fifteen inductors connected to the bidirectional signal-transmission pins in series. In a preferred embodiment, the inductor row 120R may include eleven inductors connected to the bidirectional signal-transmission pins and unidirectional signal-transmission pins in series. Referring to FIG. 11, the memory chip 130 has an approximately planar active surface SA, an approximately planar back surface SB remote from the active surface SA, and a pair of second edges E2 connecting the active surface SA and the back surface SB. The pair of second edges E2 are parallel to the pair of first edges E1 and define the width of the memory chip 130. In some embodiments, the memory chip 130 is centrally located on the carrier member 100, with the pair of second edges E2 surrounded by the inductors 120. In some embodiments, the memory chip 130 may be mounted on the carrier member 100 in a face-down manner.

Specifically, the active surface SA of the memory chip 130 is placed on the first surface S1 of the carrier member 100 and thus a portion P1 of the active surface SA is exposed through the opening O1. In some embodiments, a plurality of bonding pads 132 may be formed on the portion P1 of the active surface SA exposed by the opening O1. There is no limitation to the actual configuration of the bonding pads 132. In some embodiments, the bonding pads 132 are arranged in a matrix manner on the portion P1. In preferred embodiments, the bonding pads 132 are symmetrically arranged two by two in a row on the portion P1.

Figure 12B:
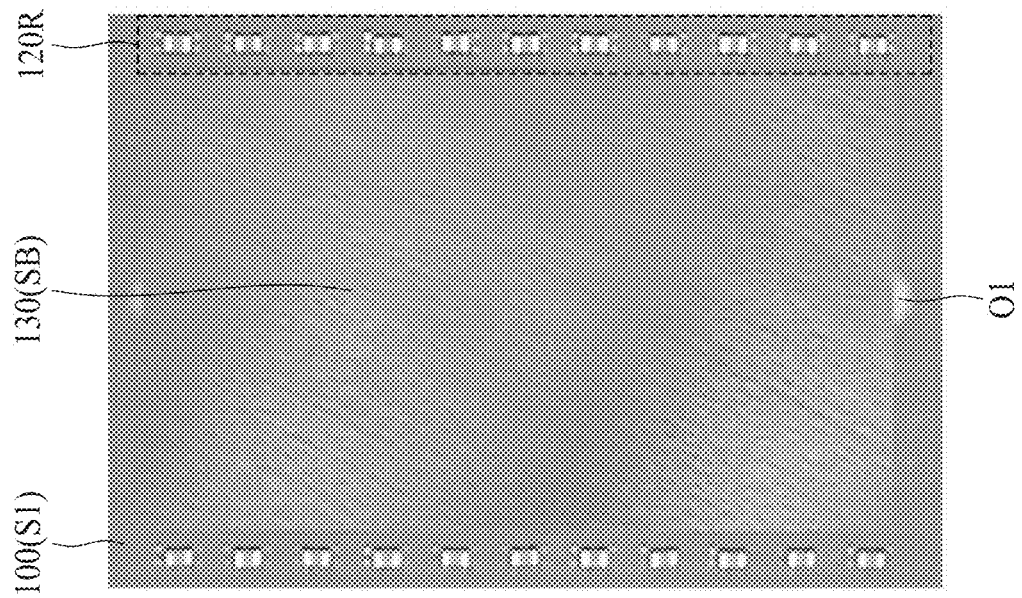
FIGS. 12A and 12B are images showing the memory chip mounted on the carrier member, in accordance with some embodiments of the present disclosure.
Figure 12A:
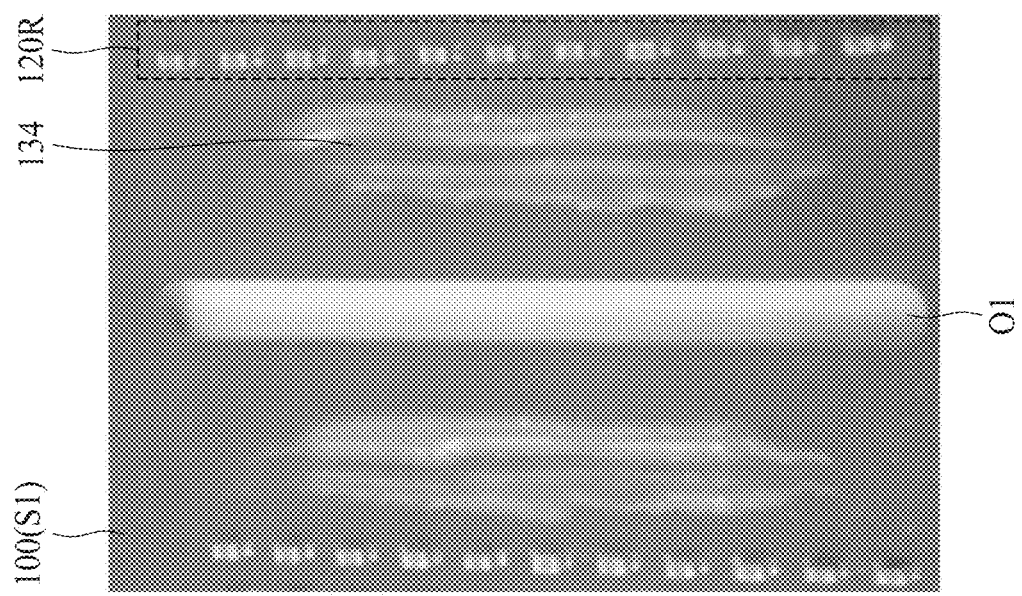

FIGS. 12A and 12B are images showing the memory chip 130 mounted on the carrier member 100. Referring to FIG. 12A, after the inductor rows 120R are disposed on the carrier member 100, a die-attaching material 134 is applied to the first surface S1 at both sides of the opening O1. Subsequently, referring to FIG. 12B, the memory chip 130 is placed face down, aligned with the opening O1 and then firmly attached to the carrier member 100. In some embodiments, the die-attaching material 134 may not only provide a solder function but also act as a conductive medium between the memory chip 130 and the conductive traces 112 on the carrier member 100. Therefore, the memory chip 130 may be electrically coupled to the internal circuit 114 in the carrier member 100 through the die-attaching material 134 and the conductive traces 112. In FIGS. 12A and 12B, eleven inductors 120 are lined up and symmetrically located at either side of the memory chip 130 on the first surface S1 of the carrier member 100. Therefore, in an embodiment of the present disclosure, twenty-two inductors 120 in total are paired with one memory chip 130.

Figure 13:
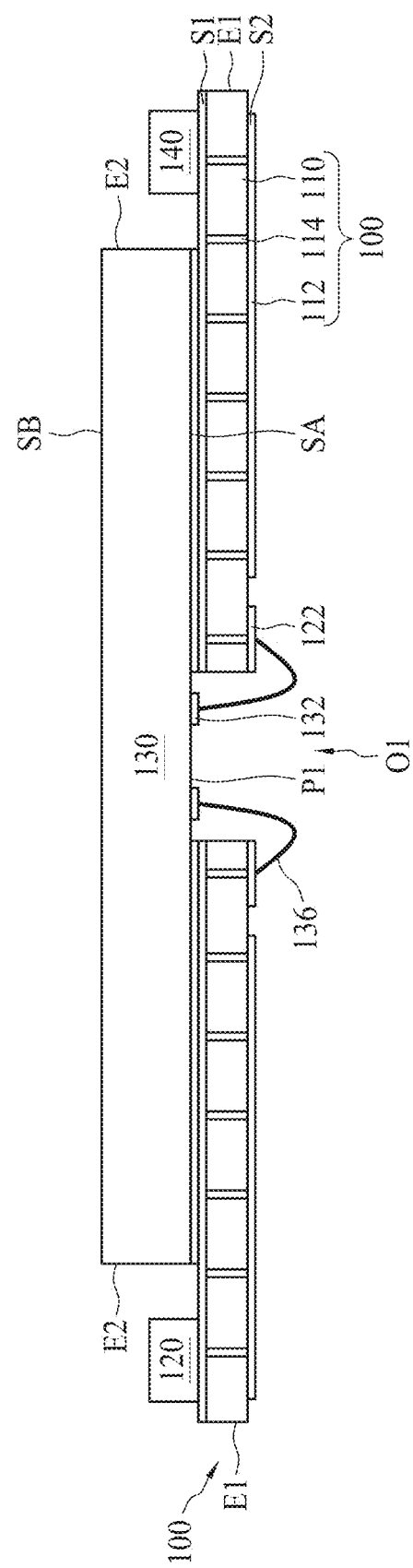
FIG. 13 is a schematic cross-sectional view of the carrier member in FIG. 10 taken along the line C-C, in accordance with some embodiments of the present disclosure.
Figure 14:
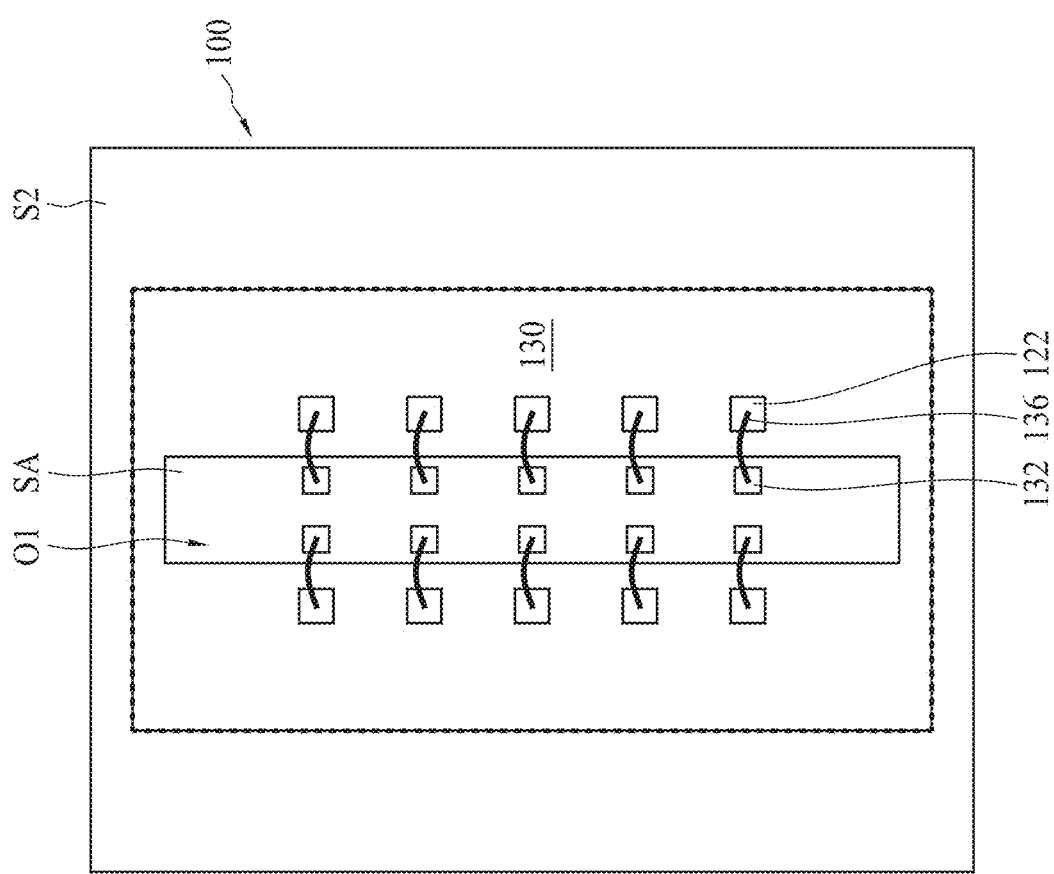
FIG. 14 is a bottom view showing the wire bonding between the memory chip and the carrier member, in accordance with some embodiments of the present disclosure.

With reference to FIGS. 13 and 14, a plurality of bonding wires 136 are employed to electrically connect the memory chip 130 to the carrier member 100 according to step S107 in FIG. 5. FIG. 13 is a schematic cross-sectional view of the carrier member in FIG. 10 taken along the line C-C, and FIG. 14 is a bottom view showing the wire bonding between the memory chip 130 and the carrier member 100. Referring to FIG. 13, the bonding wires 136, passing through the opening O1, electrically connect the bonding pads 132 on the memory chip 130 to the conductive pads 122 on the carrier member 100. In some embodiments, the method of connecting the bonding wires 136 may include any known method such as ultrasonic bonding, thermocompression bonding or thermosonic bonding. In some embodiments, the bonding wires 136 may include any of a variety of electrically conductive materials including, for example, metals such as gold (Au), copper (Cu), aluminum (Al), metal alloys, and/or other suitable materials. As a result, the bonding wires 136 provide an electrical connection between the memory chip 130 and the carrier member 100. Referring to FIG. 14, a portion of the active surface SA of the memory chip 130 and the complete second surface S2 of the carrier member 100 are shown. The memory chip 130 is represented by a dashed rectangle to indicate a portion of the memory chip 130 behind the carrier member 100 that is not visible, while the other portion of the memory chip 130 is visible through the opening O1. As can be seen in FIG. 14, the opening O1 is substantially centered within the memory chip 130. In some embodiments, the bonding pads 132 for facilitating electrical attachment of the memory chip 130 are arranged in two rows. Further, the conductive pads 122 on the carrier member 100 are also arranged in two rows. In some embodiments, the rows of the bonding pads 132 are parallel to the rows of the conductive pads 122. In some embodiments, one of the bonding wires 136 extending through the opening O1 connects one of the bonding pads 132 to one of the conductive pads 122 nearest thereto. Therefore, the memory chip 130 is electrically connected to the carrier member 100 via the plurality of bonding wires 136.

Figure 15:
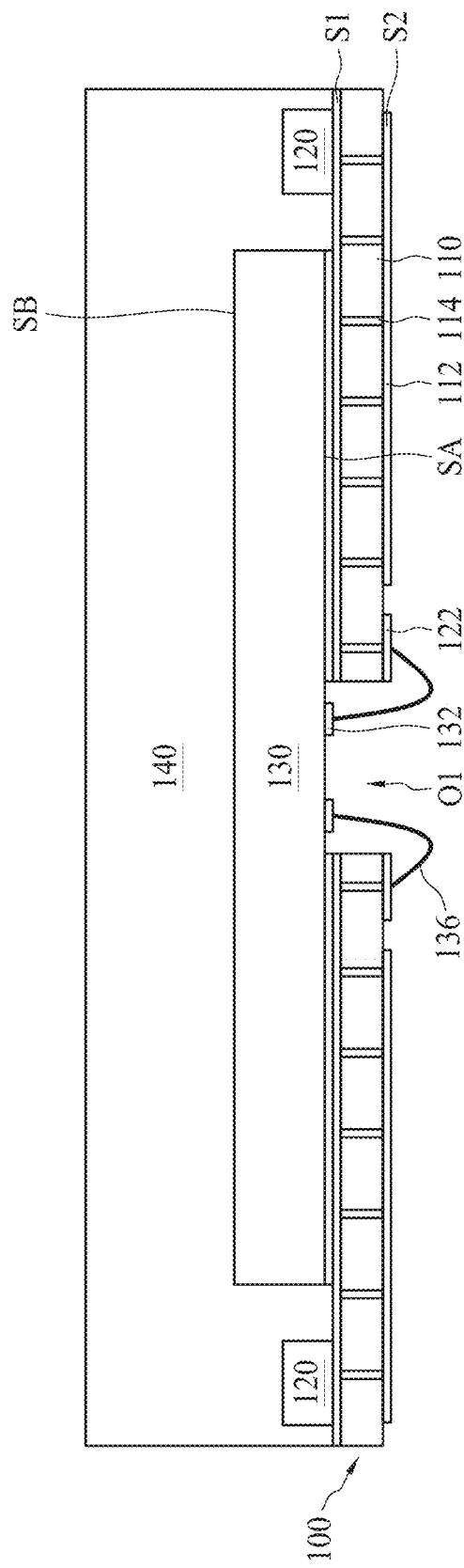
FIG. 15 is a schematic cross-sectional view showing a first insulative structure formed on the carrier member, in accordance with some embodiments of the present disclosure.

With reference to FIG. 15, a first insulative structure 140 is formed on the carrier member 100 according to step S109 in FIG. 5. In some embodiments, the first insulative structure 140 may be formed by depositing a molding compound, for example, a thermosetting resin in solid form, on the carrier member 100. Next, heat and/or pressure is applied to the molding compound. After being transformed into liquid form, the molding compound becomes flowable and may be pushed by capillary interaction and/or pressure flow. The flowable molding compound may cover the memory chip 130, the inductors 120 and the first surface S1 of the carrier member 100. In addition, the flowable molding compound may fill the gap between the memory chip 130 and the inductors 120 and the gap between the memory chip 130 and the carrier member 100. Subsequently, after the molding compound is cooled, it attains a solid form, and at such time the first insulative structure 140 is generally formed. Still referring to FIG. 15, the first insulative structure 140 substantially encapsulates the memory chip 130 and the inductors 120 in order to protect the memory chip 130 and the inductors 120. In some embodiments, a polishing process may be performed to planarize the first insulative structure 140. In some embodiments, the polishing process may remove a portion of the first insulative structure 140 without exposing the back surface SB of the memory chip 130. In other embodiments, the polishing process may remove a portion of the first insulative structure 140 to expose the complete back surface SB of the memory chip 130, and at such time, an additional component such as a heat sink (not shown) may be attached to the back surface SB of the memory chip 130. In some embodiments, the first insulative structure 140 can also be made of more than one substance, for instance, a molding compound which may be used to encapsulate the memory chip 130 and the inductors 120, while a different compound which may be used to fill the gap between the memory chip 130 and the carrier member 100.

Figure 16:
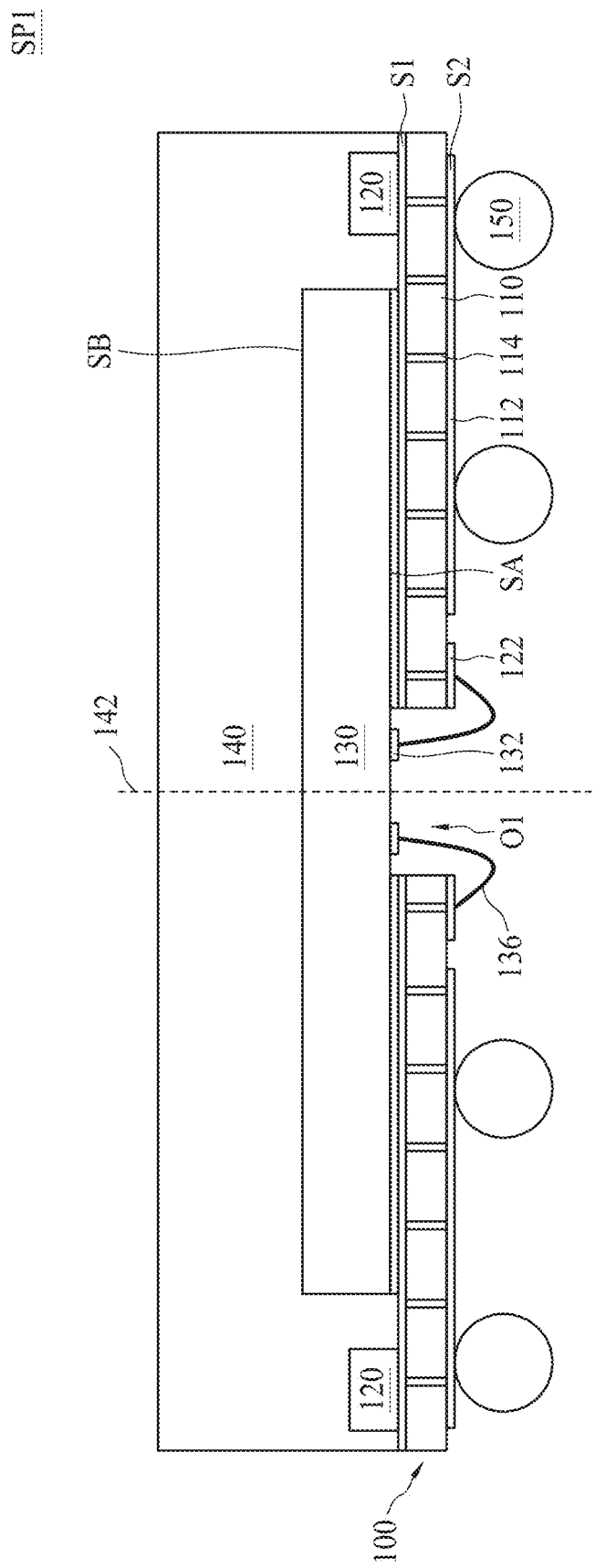
FIG. 16 is a schematic cross-sectional view showing multiple solder balls mounted on the carrier member, in accordance with some embodiments of the present disclosure.

With reference to FIG. 16, multiple solder balls 150 are mounted on the carrier member 100 according to step S111 in FIG. 5. Specifically, the solder balls 150 are attached to the second surface S2 of the substrate 110 using a ball grid array (BGA) technology. In some embodiments, the BGA technology utilizes an array of metal balls as a means of providing external electrical connection. First, a solder paste (not shown) is applied to the conductive traces 112 on the second surface S2 of the carrier member 100. In some embodiments, the solder paste may be applied by brushing, spraying, stenciling, or other methods. The solder paste generally has an acidic component that removes oxide barriers, and an adhesive quality that helps to prevent movement during the process. Once the solder paste is in place, the solder balls 150 may be physically placed in contact with the solder paste using, for example, a pick and place operation, although any suitable placement method may be utilized. After the solder balls 150 are in contact with the solder paste, a reflow process may be performed to heat the solder paste to a suitable predetermined temperature. The reflow process physically bonds the solder balls 150 to the conductive traces 112 on the second surface S2 of the carrier member 100 via the solder paste. In some embodiments, the solder paste may not only provide a solder function but also act as a conductive medium between the solder balls 150 and the carrier member 100. Therefore, the solder balls 150 may be electrically connected to the carrier member 100 by the solder paste. After the solder balls 150 are mounted on the carrier member 100, a semiconductor package SP1 is generally formed. Still referring to FIG. 16, the semiconductor package SP1 generally has a structure that is symmetric about the line 142.

Figure 17:
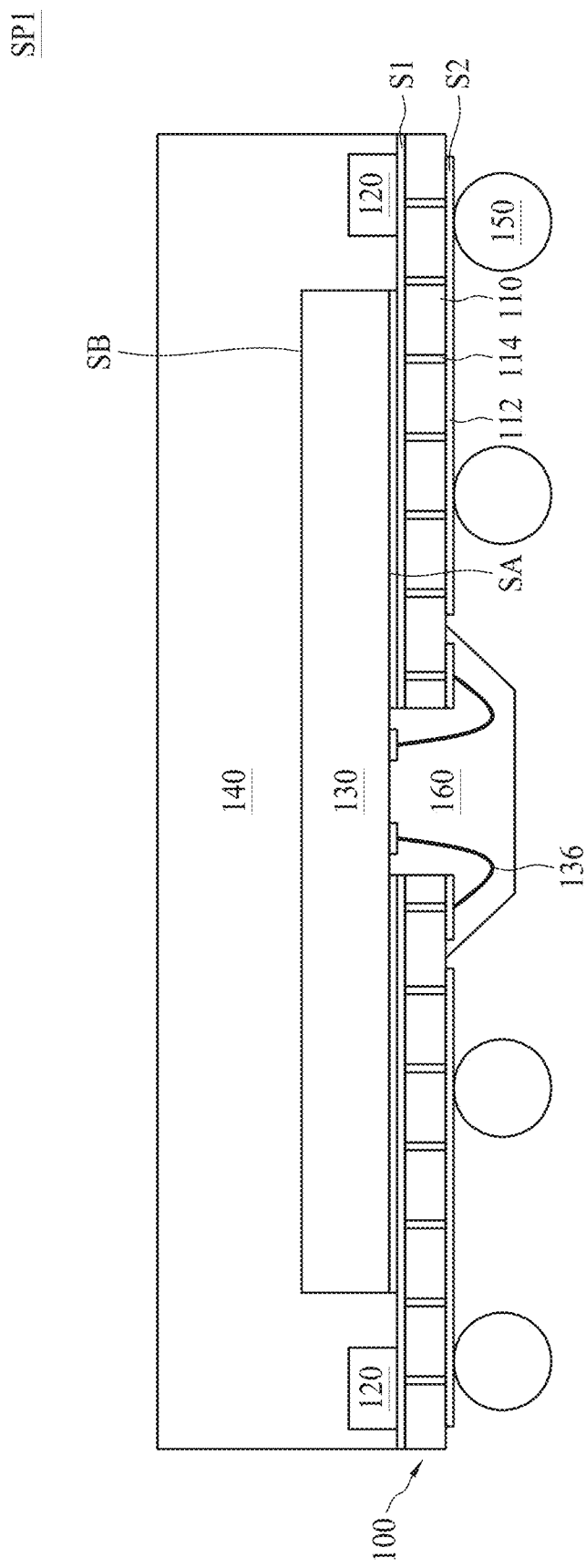
FIG. 17 is a schematic cross-sectional view showing a second insulative structure formed on the carrier member, in accordance with some embodiments of the present disclosure.

With reference to FIG. 17, in some embodiments, a second insulative structure 160 may be formed on the carrier member 100. In some embodiments, the second insulative structure 160 may be formed by dispensing an underfill compound into the opening O1. The underfill compound covers the exposed active surface SA of the memory chip 130 and encapsulates the bonding wires 136. In some embodiments, the second insulative structure 160 includes the same material as the first insulative structure 140. In other embodiments, the second insulative structure 160 includes a material different from that of the first insulative structure 140. In some embodiments, the formation of the second insulative structure 160 may be optionally achieved prior to mounting the solder balls 150 onto the carrier member 100. Although the second insulative structure 160 is not necessarily required, the bonding wires 136, the bonding pads 132 and the exposed active surface SA of the memory chip 130, which are relatively vulnerable, are preferably encapsulated by the second insulative structure 160. The second insulative structure 160 serves to protect the bonding wire 136 from mechanical or electrical shock.

Figure 18:
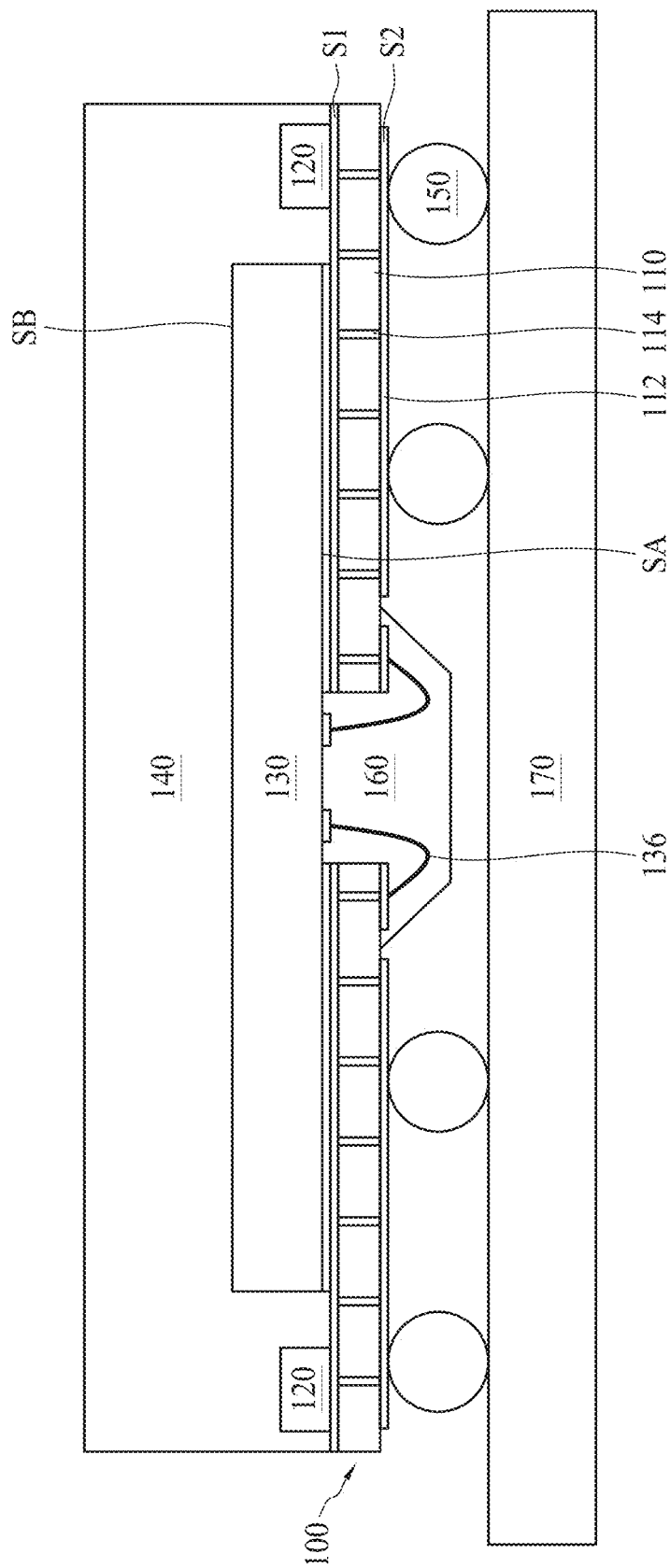
FIG. 18 is a schematic cross-sectional view showing a semiconductor package attached to a printed circuit board, in accordance with some embodiments of the present disclosure.

With reference to FIG. 18, the semiconductor package SP1 may be attached to a printed circuit board (PCB) 170. In some embodiments, the method for mounting the semiconductor package SP1 onto the PCB 170 may employ a surface mount technology (SMT). For example, first, the solder balls 150 are aligned with their respective attachment sites on an upper surface SU of the PCB 170. Next, the semiconductor package SP1 is placed on the PCB 170 with the solder balls 150 touching the upper surface SU. Subsequently, a reflow process may be performed to change the solder balls 150 to a molten state. The molten solder balls 150 can therefore be attached to the upper surface SU of the PCB 170. A surface tension of the solder balls 150 keeps them aligned in their proper locations on the PCB 170 until the solder balls 150 cool and solidify.

Figure 19A:
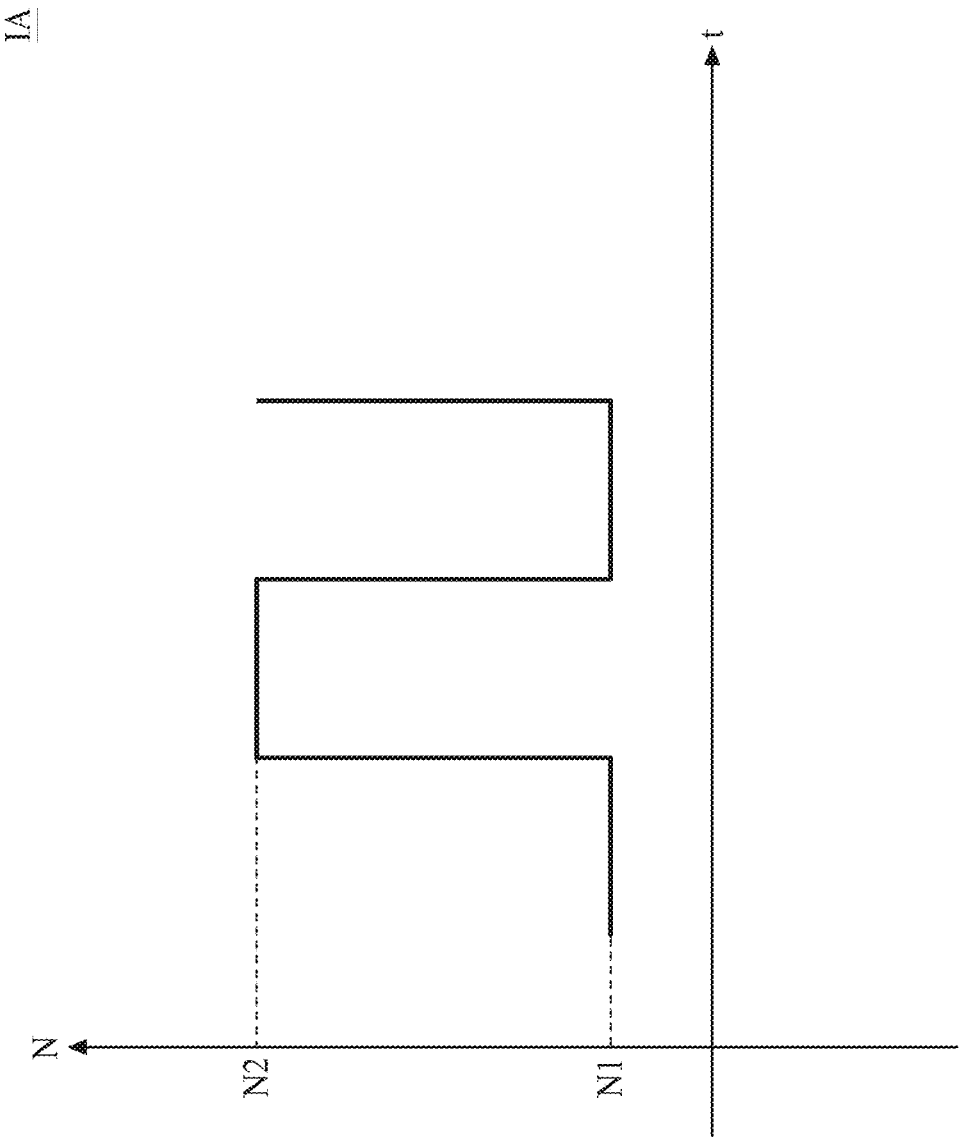
FIG. 19A is a schematic diagram showing a first signal generated by a memory controller, wherein the first signal represents a piece of data or control signal that is to be transmitted to the memory chip in FIG. 18, in accordance with some embodiments of the present disclosure.
Figure 19B:
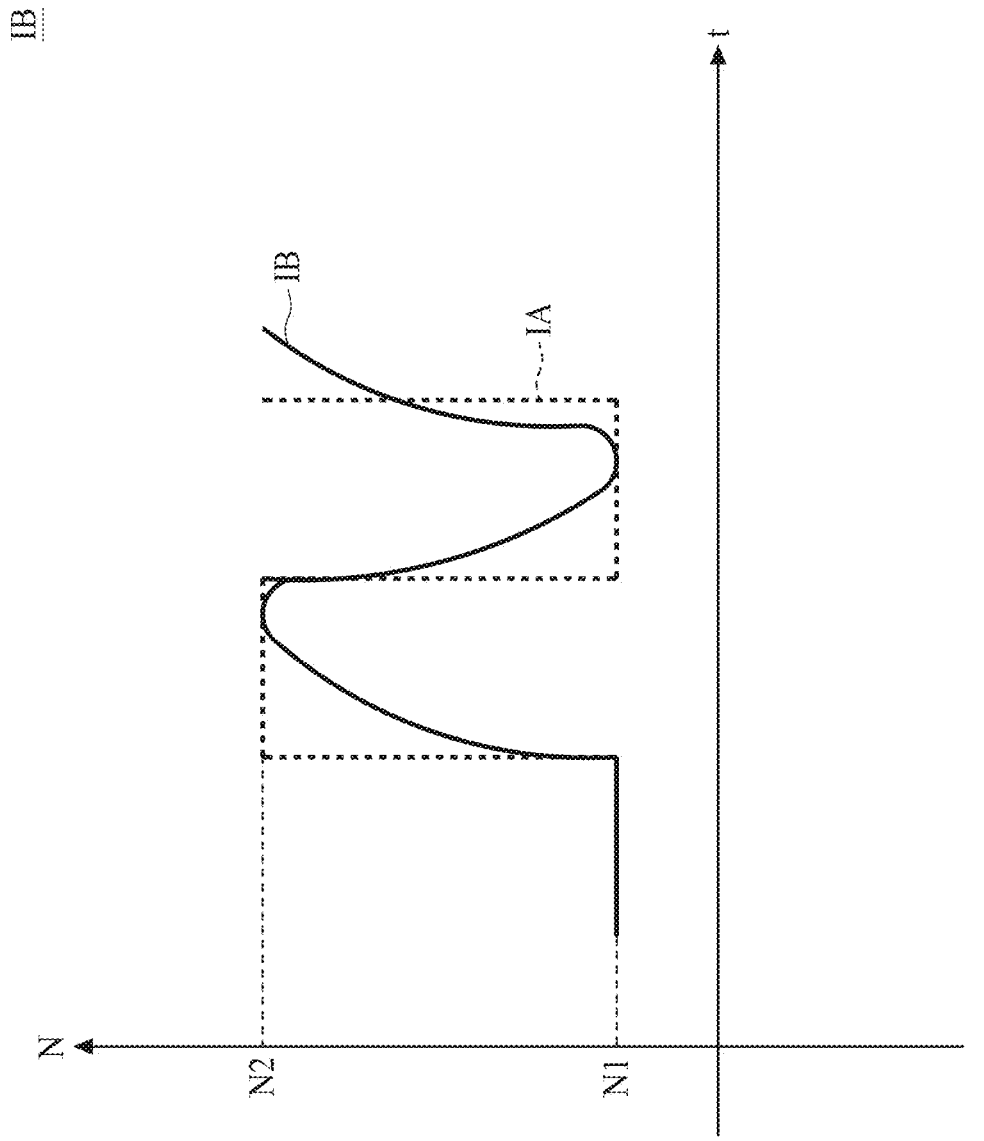
FIG. 19B is a schematic diagram showing a second signal input into the memory chip in FIG. 18 after the piece of data or control signal is transmitted through a transmission path, in accordance with some embodiments of the present disclosure.

In some embodiments, the memory chip 130 in the semiconductor package SP1 in FIG. 18 may be coupled to a memory controller. With reference to FIGS. 19A and 19B, when the memory chip 130 operates at high frequencies, e.g., at 2133 MHz to 4266 MHz, FIG. 19A shows a first signal IA generated by the memory controller, wherein the first signal IA represents a piece of data or control signal that is to be transmitted to the memory chip 130 in FIG. 18. FIG. 19B shows a second signal IB input into the memory chip 130 after the piece of data or control signal is transmitted through a transmission path (not shown) and one of the inductors 120 in the semiconductor package SP1. As can be seen by comparing FIG. 19B and FIG. 3B, the significant overshoot OS and undershoot US shown in FIG. 3B is greatly suppressed with the inclusion of the inductors 120. Specifically, the inductors 120 can reduce the rising speed and/or dropping speed of a signal when the memory chip 130 is in operation. At such moment, the signal overshoot OS and/or undershoot US may be reduced. The waveform of the signal passing through one of the inductors 120 and to be input into the memory chip 130 can be stabilized due to the reduction of signal overshoot OS and/or undershoot US. In addition, the impedance produced by the inductors 120 increases as the operating frequency of the inductors 120 increases. Therefore, the inductors 120 can be applied to a wide range of operating frequencies and the capability of suppressing the signal overshoot or undershoot can be further increased when the inductors 120 operate at a higher frequency. As a result, with the inclusion of the inductors 120 at both sides of the memory chip 130, the undesirable signal overshoot/undershoot which occurs in the data signal DQ transmitted from the memory controller to the memory chip 130 or the data signal DQ transmitted from the memory chip 130 to the memory controller can be suppressed. In addition, signals transmitted to the memory chip 130 may be output without distortion and the signal validity can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, compositions of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor package, comprising:
    a carrier member;
    a plurality of inductors on the carrier member; and
    a memory chip on the carrier member, the memory chip comprising a plurality of bidirectional signal-transmission pins electrically coupled to the inductors;
    wherein the memory chip further comprises a plurality of unidirectional signal-transmission pins, utilized in a partial write operation in which at least some of write data transmitted through the bidirectional signal-transmission pins is masked, electrically connected to the inductors.

2. The semiconductor package according to claim 1, wherein the carrier member includes a first surface, a second surface remote from the first surface, and a centrally-located opening extending from the first surface to the second surface, the inductors and the memory chip being disposed on the first surface and electrically coupled to the carrier member.

3. The semiconductor package according to claim 2, wherein the carrier member includes a plurality of conductive pads and the memory chip includes a plurality of bonding pads, wherein a plurality of bonding wires, passing through the opening, electrically connect the bonding pads on the memory chip to the conductive pads on the carrier member.

4. The semiconductor package according to claim 2, further comprising a first insulative structure substantially encapsulating the memory chip and the inductors.

5. The semiconductor package according to claim 4, wherein the first insulative structure covers a portion of the first surface of the carrier member.

6. The semiconductor package according to claim 2, further comprising a plurality of solder balls attached to the second surface of the carrier member, the solder balls being electrically connected to the carrier member.

7. The semiconductor package according to claim 2, wherein the carrier member further includes a substrate between the first surface and the second surface, a plurality of conductive traces on the first surface and the second surface, and an internal circuit, comprised of at least one layer, within the substrate and electrically coupled to the conductive traces.

8. The semiconductor package according to claim 7, wherein the inductors are electrically coupled to the internal circuit in the carrier member through the conductive traces.

9. The semiconductor package according to claim 1, wherein the inductors form two parallel inductor rows, located at opposite sides of the memory chip.

10. A method of fabricating a semiconductor package, comprising:
    providing a carrier member;
    disposing a plurality of inductors on the carrier member; and
    disposing a memory chip on the carrier member, the memory chip comprising a plurality of bidirectional signal-transmission pins electrically coupled to the inductors;
    wherein the memory chip further comprises a plurality of unidirectional signal-transmission pins, utilized in a partial write operation in which at least some of write data transmitted through the bidirectional signal-transmission pins are masked, electrically coupled to the inductors.

11. The method according to claim 10, wherein the carrier member includes a first surface, a second surface remote from the first surface, and a centrally-located opening extending from the first surface to the second surface, the inductors and the memory chip being disposed on the first surface and electrically coupled to the carrier member.

12. The method according to claim 11, wherein the carrier member includes a plurality of conductive pads and the memory chip includes a plurality of bonding pads, wherein a plurality of bonding wires, passing through the opening, electrically connect the bonding pads on the memory chip to the conductive pads on the carrier member.

13. The method according to claim 11, further comprising forming a first insulative structure to substantially encapsulate the memory chip and the inductors.

14. The method according to claim 13, wherein the first insulative structure covers a portion of the first surface of the carrier member.

15. The method according to claim 11, further comprising mounting a plurality of solder balls on the second surface of the carrier member, the solder balls being electrically connected to the carrier member.

16. The method according to claim 11, wherein the carrier member further includes a substrate between the first surface and the second surface, a plurality of conductive traces on the first surface and the second surface, and at least one layer of internal circuit within the substrate and electrically coupled to the conductive traces.

17. The method according to claim 16, wherein the inductors are electrically coupled to the internal circuit in the carrier member through the conductive traces.

18. The method according to claim 10, wherein the inductors form two parallel inductor rows, located at opposite sides of the memory chip.

* * * * *